(12) United States Patent
Shimakawa et al.

(10) Patent No.: US 8,664,703 B2
(45) Date of Patent: Mar. 4, 2014

(54) DISPLAY DEVICE HAVING A SHIELD

(75) Inventors: Shin-ichi Shimakawa, Nara (JP);
Shigekazu Horino, Osaka (JP); Takao Takano, Chiba (JP)

(73) Assignee: Panasonic Liquid Crystal Display Co., Ltd., Hyogo (JP)

(*) Notice: Subject to any disclaimer, the term of this patent is extended or adjusted under 35 U.S.C. 154(b) by 0 days.

(21) Appl. No.: 13/599,753

(22) Filed: Aug. 30, 2012

(65) Prior Publication Data
US 2013/0048997 A1 Feb. 28, 2013

(30) Foreign Application Priority Data
Aug. 30, 2011 (JP) ................................ 2011-187037

(51) Int. Cl.
*H01L 31/062* (2012.01)
(52) U.S. Cl.
USPC .................................. 257/294; 257/E29.151
(58) Field of Classification Search
USPC ............... 257/59, 98, 72, 252, 291, 294, 443, 257/E29.151, E27.1, E27.125; 438/149
See application file for complete search history.

(56) References Cited

U.S. PATENT DOCUMENTS

| | | | |
|---|---|---|---|
| 7,019,807 B2* | 3/2006 | Yamasaki | 349/138 |
| 7,176,989 B2* | 2/2007 | Takahara et al. | 349/39 |
| 7,283,182 B2* | 10/2007 | Sato | 349/44 |
| 8,017,456 B2* | 9/2011 | Yamazaki et al. | 438/149 |
| 8,023,042 B2* | 9/2011 | Yamazaki et al. | 348/552 |
| 2002/0093027 A1* | 7/2002 | Zhong et al. | 257/98 |
| 2005/0237464 A1 | 10/2005 | Oke et al. | |
| 2008/0203390 A1* | 8/2008 | Kim et al. | 257/59 |
| 2010/0091212 A1* | 4/2010 | Moon et al. | 349/43 |
| 2010/0207121 A1* | 8/2010 | Hino et al. | 257/59 |
| 2012/0190145 A1* | 7/2012 | Yagi | 438/34 |

FOREIGN PATENT DOCUMENTS

JP 2002-090779 A 3/2002

* cited by examiner

*Primary Examiner* — Quoc Hoang
(74) *Attorney, Agent, or Firm* — McDermott Will & Emery LLP

(57) ABSTRACT

The instant application describes a display device that includes a substrate; a gate electrode provided on the substrate; a gate insulating film provided on the gate electrode; a semiconductor layer provided on the gate insulating film; a source electrode and a drain electrode provided on the semiconductor layer; a protective insulating film provided on the source electrode and the drain electrode; a pixel electrode provided on the protective insulating film, and connected to one of the source electrode and the drain electrode through a contact hole formed through the protective insulating film; and a shield provided on the protective insulating film, the shield not being electrically connected to the pixel electrode.

6 Claims, 8 Drawing Sheets

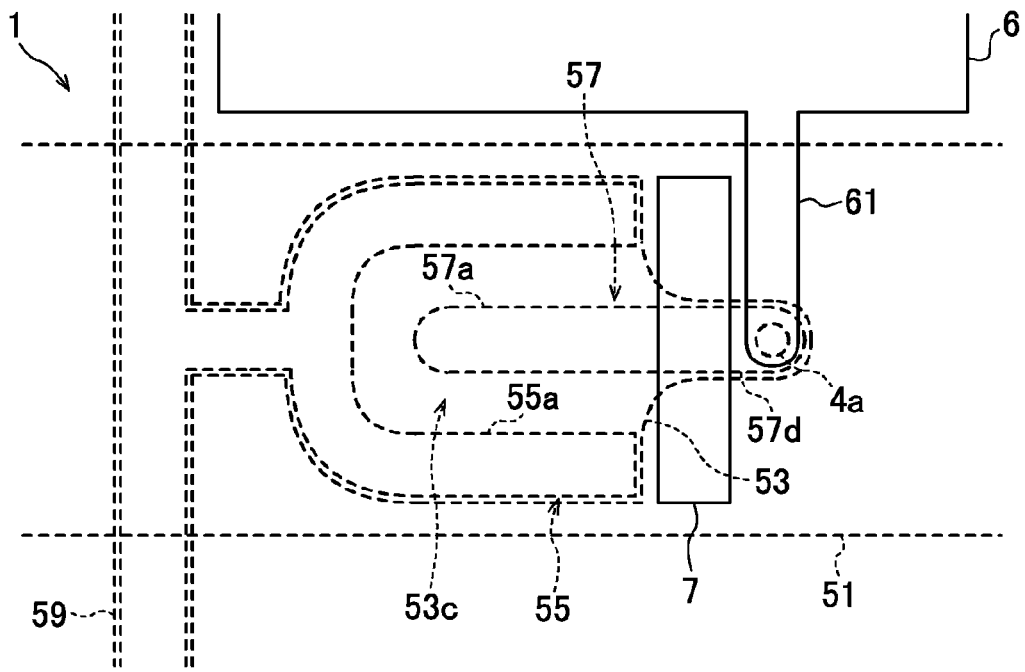
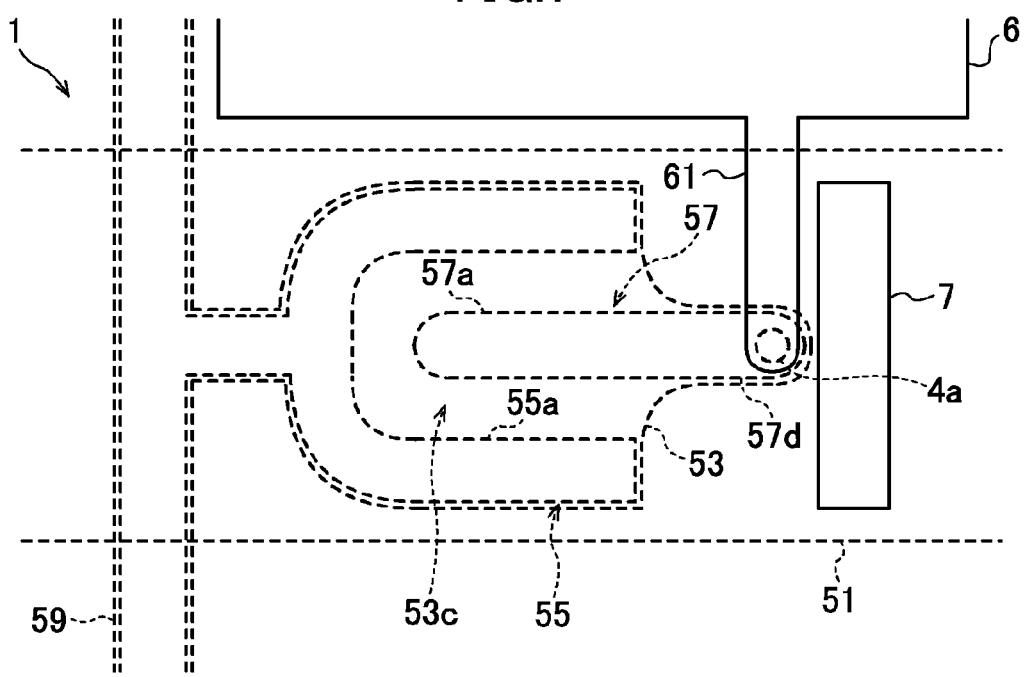

DISPLAY DEVICE HAVING A SHIELD

CROSS-REFERENCE TO RELATED APPLICATION

The present application claims priority from Japanese application JP 2011-187037 filed on Aug. 30, 2011, the entire content of which is hereby incorporated by reference into this application.

TECHNICAL FIELD

The present application relates to a liquid crystal display device, in particular, a configuration of a laminate including a thin-film transistor (TFT).

BACKGROUND

A thin-film transistor (TFT) substrate of a liquid crystal display device including a TFT as a switching element may include a transparent substrate, a gate electrode, a gate insulating film, a semiconductor layer, a source electrode, a drain electrode, a protective insulating film, and a pixel electrode. The gate electrode may be provided on the transparent substrate. The gate insulating film may be provided on the gate electrode. The semiconductor layer may be provided on the gate insulating film. The source electrode and the drain electrode may be provided on the semiconductor layer. The protective insulating film may be provided on the source electrode and the drain electrode. The pixel electrode may be connected to the source electrode or the drain electrode. A region of the semiconductor layer between the source electrode and the drain electrode may serve as a channel-formation region where a channel is formed.

As a method for fabricating the liquid crystal display device described above, there is known a so-called four-photo-step fabrication method in which the TFT substrate is fabricated in four photolithography steps (hereinafter, also referred to as "photo-steps") (see Japanese Patent Application Laid-open No. 2002-90779).

As an example of the four-photo-step fabrication method, there are conducted a first photo-step for forming the gate electrode, a second photo-step for forming the semiconductor layer, the source electrode, and the drain electrode, a third photo-step for forming a contact hole through the protective insulating film, and a fourth photo-step for forming the pixel electrode to be connected to the source electrode or the drain electrode through the contact hole.

In the four-photo-step fabrication method, the semiconductor layer, the source electrode, and the drain electrode may be formed in the single photo-step. Therefore, the semiconductor layer may be located below all of the source electrode and the drain electrode. In this case, the semiconductor layer, which extends beyond the range of the gate electrode when viewed in a plan view, may receive light from a backlight unit and may generate a light leakage current. When the light leakage current is generated, there is a risk in that an OFF-leakage current may become high to generate a residual image.

Therefore, there is a need for a display device that can suppress the generation of such light leakage current.

SUMMARY

In one general aspect, the instant application describes a display device that includes a substrate; a gate electrode provided on the substrate; a gate insulating film provided on the gate electrode; a semiconductor layer provided on the gate insulating film; a source electrode and a drain electrode provided on the semiconductor layer; a protective insulating film provided on the source electrode and the drain electrode; a pixel electrode provided on the protective insulating film, and connected to one of the source electrode and the drain electrode through a contact hole formed through the protective insulating film; and a shield provided on the protective insulating film, the shield not being electrically connected to the pixel electrode.

The above general aspect may include one or more of the following features. The substrate may include a transparent substrate. In a plan view, the semiconductor layer may be provided within a range of the gate electrode. In a plan view, the source electrode and the drain electrode may be provided within a range of the semiconductor layer. The pixel electrode and the shield may be made from a transparent conductive film.

In a plan view, the shield may be provided between the contact hole and a portion of the semiconductor layer between the source electrode and the drain electrode. Alternatively or additionally, the shield may be provided above a portion of the semiconductor layer between the source electrode and the drain electrode. One of the source electrode and the drain electrode may include a bifurcated portion. Another of the source electrode and the drain electrode may include an inserted portion provided in an inner space of the bifurcated portion; and a connection portion connected to the pixel electrode outside the bifurcated portion. The shield may be provided above the bifurcated portion, the inserted portion, and a portion of the semiconductor layer between the bifurcated portion and the inserted portion. The shield may be electrically connected to a shield of another pixel.

The display device may include a liquid crystal display device.

In another general aspect, the display device of the instant application includes a substrate; a gate electrode provided on the substrate; a gate insulating film provided on the gate electrode; a semiconductor layer provided on the gate insulating film; a source electrode and a drain electrode provided on the semiconductor layer; a protective insulating film provided on the source electrode and the drain electrode; a pixel electrode provided on the protective insulating film, and connected to one of the source electrode and the drain electrode through a contact hole formed through the protective insulating film; and a shield provided on the protective insulating film, an electric potential of the shield being independent from an electric potential of the pixel electrode.

According to the instant application, the formation of a backgate channel in the semiconductor layer may be suppressed by the shield which may be provided on the protective insulating film and may not be electrically connected to the pixel electrode.

Therefore, the OFF-leakage current may be suppressed. Moreover, the shield may be formed together with the pixel electrode at a time. Therefore, the fabrication may be made easier.

BRIEF DESCRIPTION OF THE DRAWINGS

The figures depict one or more implementations in accordance with the present teachings, by way of example only, not by way of limitations. In the figures, like reference numerals refer to the same or similar elements.

FIGS. 2A and 2B, respectively;

FIGS. 3A and 3B, respectively;

FIGS. 4A and 4B, respectively;

FIG. 6 is a plan view illustrating another exemplary liquid crystal display device of the present application;

FIG. 7 is a plan view illustrating another exemplary liquid crystal display device of the present application;

DETAILED DESCRIPTION

In the following detailed description, numerous specific details are set forth by way of examples in order to provide a thorough understanding of the relevant teachings. However, it should be apparent to those skilled in the art that the present teachings may be practiced without exemplary details. In other instances, well known methods, procedures, components, and/or circuitry have been described at a relatively high-level, without detail, in order to avoid unnecessarily obscuring aspects of the present concepts.

In order to suppress the generation of the light leakage current, the semiconductor layer, the source electrode, and the drain electrode may be provided within the range of the gate electrode when viewed in a plan view. In this case, however, the OFF-leakage current may become high due to a factor other than the light leakage current. The reason for the increase in the OFF-leakage current may be considered as follows.

Figure 10:
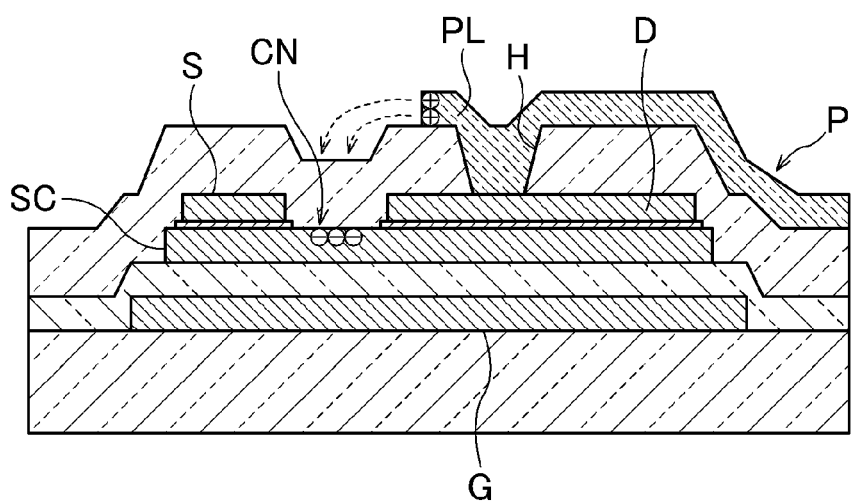
FIG. 10 is a sectional view illustrating a liquid crystal display device.

As illustrated in FIG. 10, when a semiconductor layer SC, a source electrode S, and a drain electrode D are provided within the range of a gate electrode G when viewed in a plan view, an end portion of a lead wire PL of a pixel electrode P connected to the drain electrode D through a contact hole H may be formed above the gate electrode G. With this structure, the end portion of the lead wire PL may be close to a channel-formation region CN of the semiconductor layer SC. Therefore, a channel (so-called backgate channel) may be formed in the vicinity of an upper surface of the channel-formation region CN due to the effects of charges accumulated in the end portion of the lead wire PL. It is considered that the OFF-leakage current becomes high due to the channel formed as described above.

The display device of present application has been made in view of the actual conditions described above and is configured to suppress an OFF-leakage current.

Figure 1A:
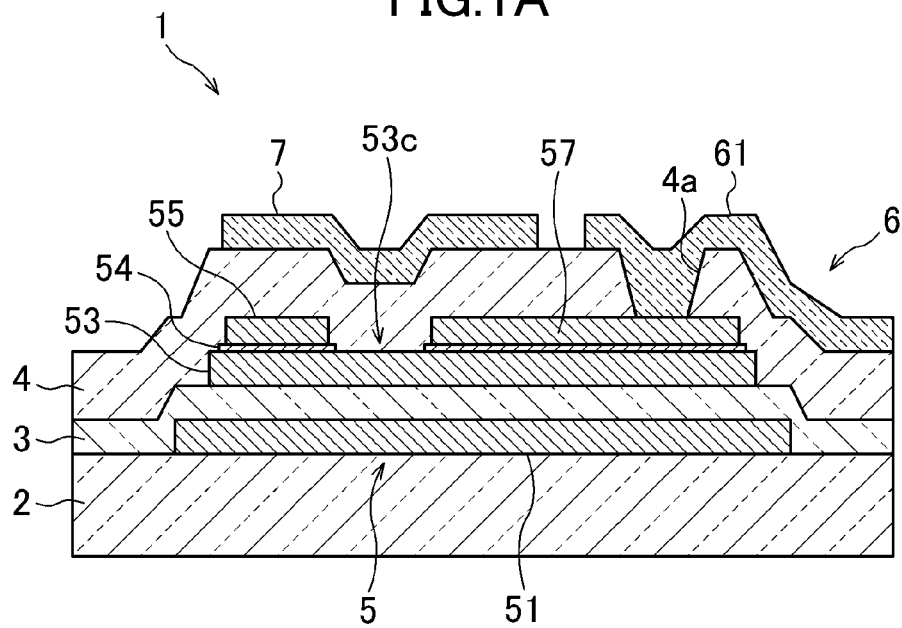
FIG. 1A is a sectional view illustrating an exemplary liquid crystal display device of the present application and FIG. 1B is a plan view thereof.
Figure 1B:
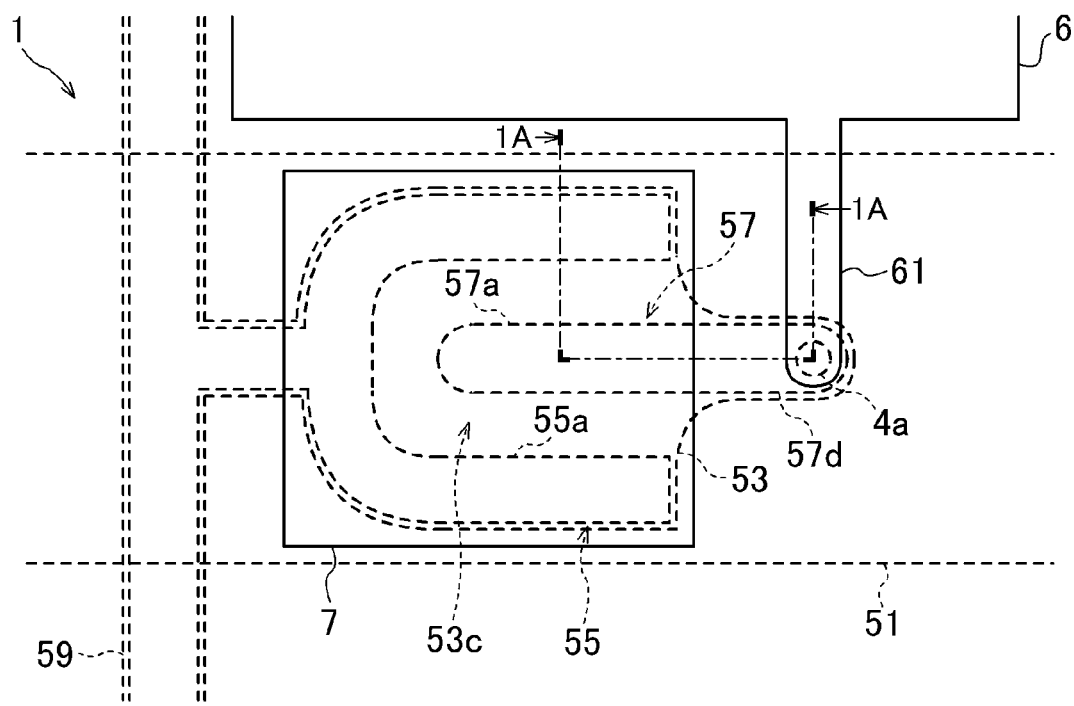

FIGS. 1A and 1B are diagrams illustrating an exemplary liquid crystal display device of the instant application. FIG. 1A is a sectional view, whereas FIG. 1B is a plan view. FIG. 1A illustrates a cross section taken along the alternate long and short dash line 1A-1A of FIG. 1B. FIGS. 1A and 1B schematically illustrate a structure of a portion corresponding to one pixel of a TFT substrate 1 included in the liquid crystal display device. The liquid crystal display device of this implementation may be configured as an active-matrix liquid crystal display device including a thin-film transistor (TFT) 5 as a switching element.

In the TFT substrate 1, the TFT 5 is provided on a transparent substrate 2 made of alkali-free glass. The TFT 5 includes a gate electrode 51, a semiconductor layer 53, a contact layer 54, a source electrode 55, and a drain electrode 57. The semiconductor layer 53 is provided above the gate electrode 51. A gate insulating film 3 is provided between the gate electrode 51 and the semiconductor layer 53. The source electrode 55 is provided above the semiconductor layer 53 with a contact layer 54 interposed between the source electrode 55 and the semiconductor layer 53. Similarly, the drain electrode 57 is provided above the semiconductor layer 53 with the contact layer 54 interposed between the drain electrode 57 and the semiconductor layer 53.

A protective insulating film 4 is provided on the TFT 5. A pixel electrode 6 and a shield 7 are provided on the protective insulating film 4. A contact hole 4a is formed through the protective insulating film 4. A lead wire 61 of the pixel electrode 6 is connected to the drain electrode 57 of the TFT 5 through the contact hole 4a. The shield 7 is provided at a distance from the pixel electrode 6 and is not electrically connected to the pixel electrode 6. Specifically, a potential of the shield 7 is independent of a potential of the pixel electrode 6.

The gate electrode 51 of the TFT 5 is made of a metal such as, for example, Cu and Al. In the illustrated example, the gate electrode 51 is included in a scanning line extending in a band-like shape. In other words, the scanning line extending in the band-like shape also serves as the gate electrode 51. The semiconductor layer 53 is made of a semiconductor such as, for example, amorphous Si (a-Si) and is provided within the range of the gate electrode 51 in a plan view as shown in FIG. 1B. The contact layer 54 is made of n-type amorphous Si (n+ a-Si). The source electrode 55 and the drain electrode 57 are made of a metal such as, for example, Cu and Al and are provided within the range of the semiconductor layer 53 in plan view as shown in FIG. 1B. The source electrode 55 is connected to a signal line 59, whereas the drain electrode 57 is connected to the pixel electrode 6. A region of the semiconductor layer 53 between the source electrode 55 and the drain electrode 57 is a channel-formation region 53c where a channel is formed.

The gate insulating film 3 and the protective insulating film 4 are made of a transparent insulating material such as, for example, SiN. The pixel electrode 6 and the shield 7 are made from a transparent conductive film made of an oxide such as, for example, tin-doped indium oxide (ITO).

The TFT substrate 1 may further include a common electrode (not shown) between the transparent substrate 2 and the gate insulating film 3. An alignment film (not shown) may be further provided on the protective insulating film 4, the pixel electrode 6, and the shield 7 of the TFT substrate 1. A polarizing plate (not shown) may be provided on a lower surface of the transparent substrate 2. In the liquid crystal display device, a liquid crystal layer is sandwiched between the TFT substrate 1 and a CF substrate (not shown) including a color filter.

The source electrode 55 of the TFT 5 includes a bifurcated portion 55a having an approximate U-like shape, which is bifurcated in a plane. The drain electrode 57 is formed linearly as a whole and includes an inserted portion 57a and a connection portion 57d. The inserted portion 57a is inserted into an inner space of the bifurcated portion 55a. The connection portion 57d is located outside of the bifurcated portion 55a. The lead wire 61 of the pixel electrode 6 is connected to the connection portion 57d through the contact hole 4a. The semiconductor layer 53 has a shape which encompasses the source electrode 55 and the drain electrode 57 when viewed in a plan view. A clearance having a predetermined width and an approximate U-like shape is formed between an inner edge of the bifurcated portion 55a of the source electrode 55 and an outer edge of the inserted portion 57a of the drain electrode 57. Below the clearance, the channel-formation region 53c is located.

The shield 7 is located above the bifurcated portion 55a of the source electrode 55, the inserted portion 57a of the drain electrode 57, and the channel-formation region 53c. Specifically, the shield 7 is formed to have a rectangular shape which is able to encompass the bifurcated portion 55a of the source electrode 55, the inserted portion 57a of the drain electrode 57, and the channel-formation region 53c. In one implementation, the shield 7 is provided so as to cover the upper surfaces of the bifurcated portion 55a, the inserted portion 57a, and the channel-formation region 53c. The shield 7 is provided at a distance from the lead wire 61 of the pixel electrode 6 connected to the connection portion 57d of the drain electrode 57. Through provision of the shield 7 in this manner, the channel-formation region 53c may be prevented from being affected by charges accumulated in the vicinity of the contact hole 4a. Therefore, the formation of a backgate channel in the channel-formation region 53c may be suppressed.

FIGS. 2A to 5B are views illustrating fabrication steps of the exemplary liquid crystal display device shown in FIGS. 1A-1B. Among FIGS. 2A to 5B, sectional views corresponding to FIGS. 2A, 3A, 4A, and 5A illustrate a state in which a photoresist is removed after thin-film processing with a photolithography step and etching is terminated. On the other hand, each of flowcharts corresponding to FIGS. 2B, 3B, 4B, and 5B illustrates main steps conducted before the state illustrated in the corresponding sectional view is achieved.

The photolithography step is a step including a series of processes of forming a resist pattern from the application of a photoresist through selective exposure to light using a photo mask to development. The detailed description thereof is herein omitted.

Figure 2A:
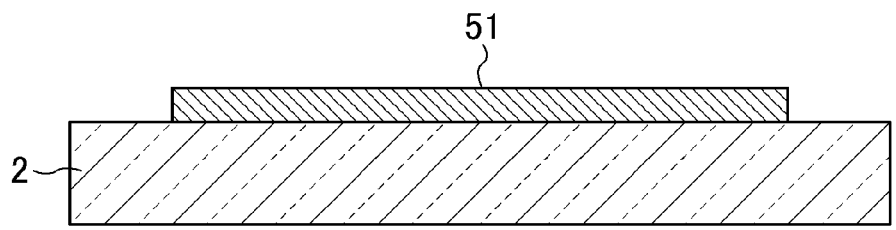
FIGS. 2A and 2B are a sectional view and a flowchart, respectively, illustrating fabrication steps of the exemplary liquid crystal display device shown in FIGS. 1A-1B.
Figure 2B:
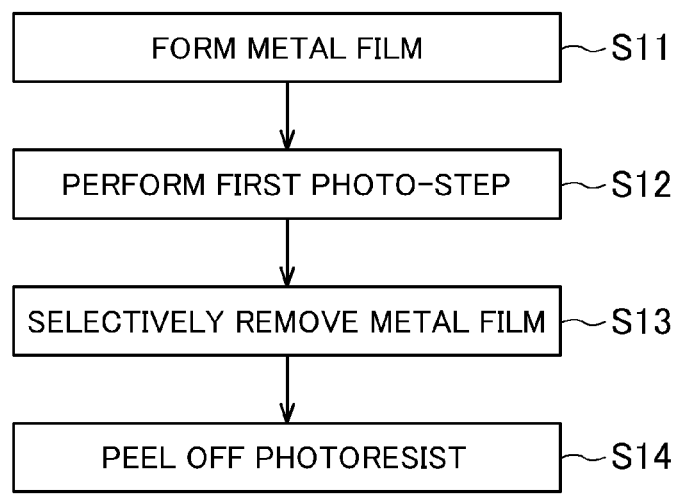

Through the steps illustrated in FIG. 2B, the gate electrode 51 and the common electrode (not shown) are formed. More specifically, first, a metal film made of a metal such as, for example, Cu or Al is formed on the transparent substrate 2 by sputtering (Step S11). Next, a resist pattern is formed on the metal film in a first photo-step (Step S12). Subsequently, the metal film is selectively etched (Step S13). Then, the photoresist is peeled off (Step S14). In this manner, the gate electrode 51 and the common electrode (not shown) are formed on the transparent substrate 2. Alternatively, by using a half-tone mask, the gate electrode 51 may include two layers, that is, a transparent conductive film and a metal film, whereas the common electrode (not shown) may include only one layer corresponding to the transparent conductive film.

Figure 3A:
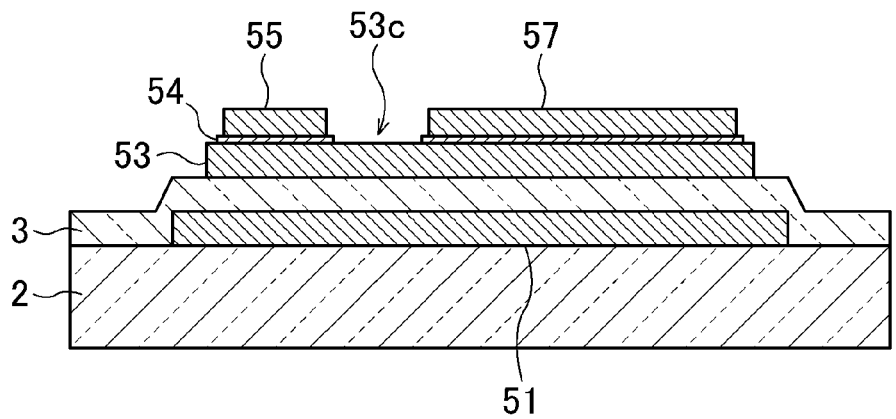
FIGS. 3A and 3B are a sectional view and a flowchart following
Figure 3B:
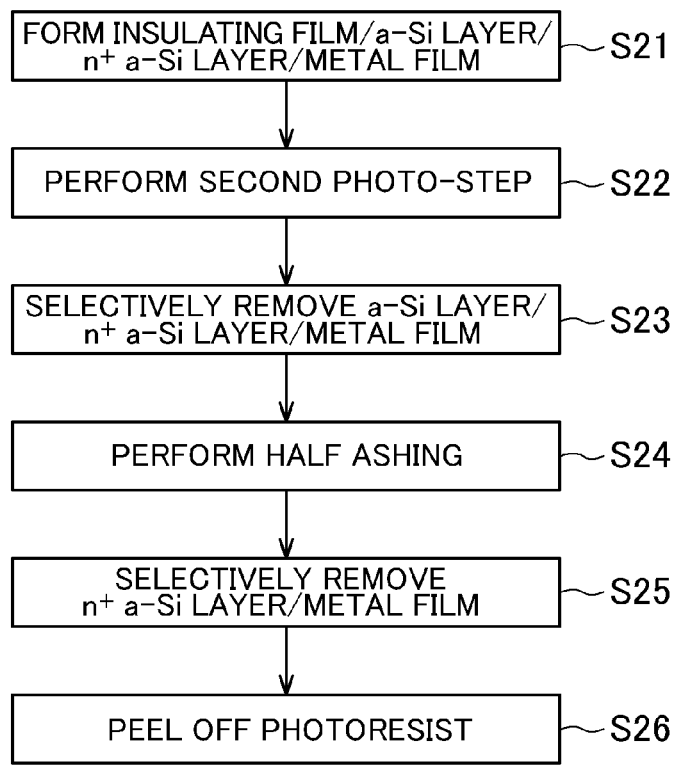

Through the steps illustrated in FIG. 3B, the gate insulating film 3, the semiconductor layer 53, the contact layer 54, the source electrode 55, and the drain electrode 57 are formed. More specifically, an ammonia gas, a silane gas, and a nitrogen gas are introduced into a reaction chamber of a CVD device to form an insulating film made of SiNx. Subsequently, the silane gas and a hydrogen gas are introduced to form an a-Si:H layer made of amorphous Si. Subsequently, the silane gas, the hydrogengas, and thephosphine gas are introduced to form an n$^+$ a-Si:H layer made of n-type amorphous Si (n$^+$ a-Si:H). Subsequently, a metal film made of a metal such as Cu or Al is formed by sputtering (Step S21). Next, a resist pattern is formed on the metal film by using a half-tone mask in a second photo-step (Step S22). In this step, the photoresist may be formed relatively thick in regions where the source electrode 55 and the drain electrode 57 are formed. On the other hand, the photoresist may be formed relatively thin in a region where the channel-formation region 53c is formed. The photoresist may not be formed in a region where the semiconductor layer 53 is not formed. Next, the metal film is etched. Subsequently, the n$^+$ a-Si:H layer and the a-Si:H layer are selectively etched with a dry-etching gas (Step S23). Next, the thinly-formed portion of the photoresist is removed by half ashing (Step S24). Next, the metal film in the region exposed by the half ashing is etched. Subsequently, the n$^+$ a-Si:H layer is selectively etched (Step S25). Thereafter, the photoresist is peeled off (Step S26). By the above-mentioned steps, the gate insulating film 3, the semiconductor layer 53, the contact layer 54, the source electrode 55, and the drain electrode 57 are formed on the gate electrode 51. Moreover, the channel-formation region 53c is formed between the source electrode 55 and the drain electrode 57.

Figure 4A:
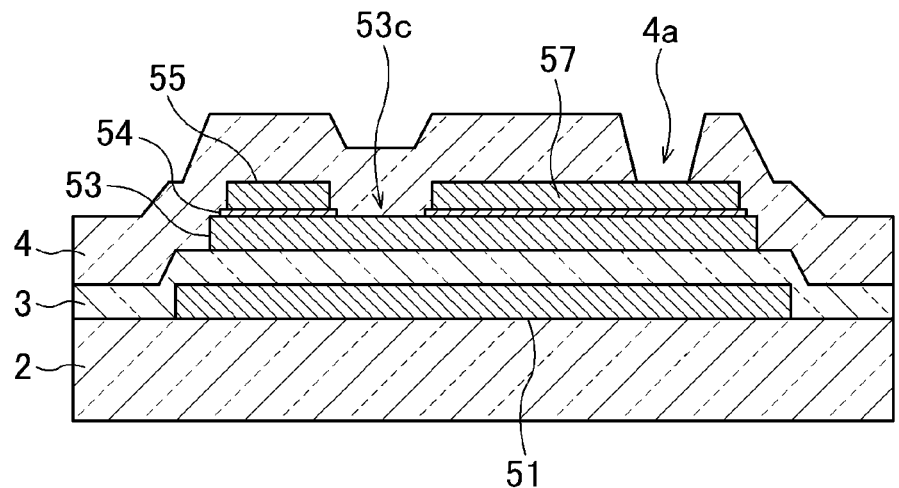
FIGS. 4A and 4B are a sectional view and a flowchart following
Figure 4B:
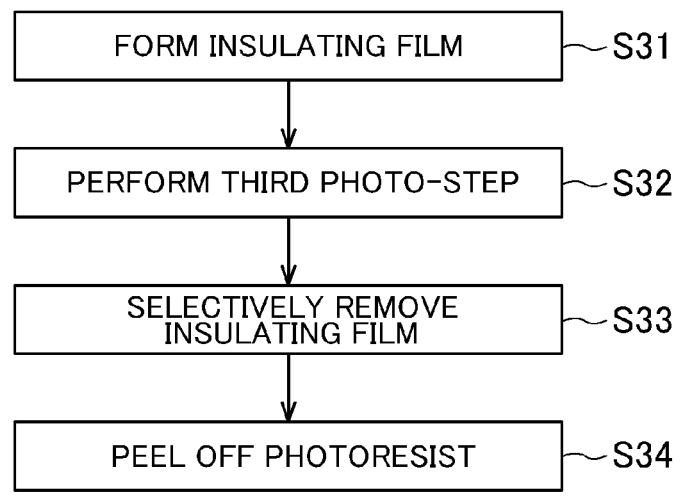

Through the steps illustrated in FIG. 4B, the protective insulating film 4 is formed. More specifically, first, the ammonia gas, the silane gas, and the nitrogen gas are introduced into the reaction chamber of the CVD device to form an insulating film made of SiNx (Step S31). Next, a resist pattern is formed on the insulating film in a third photo-step (Step S32). Next, the insulating film is selectively etched with the dry-etching gas (Step S33). In this step, the contact hole 4a, on the bottom of which the drain electrode 57 is exposed, is formed through the insulating film. Thereafter, the photoresist is peeled off (Step S34). In this manner, the protective insulating film 4 is formed on the source electrode 55 and the drain electrode 57, whereas the contact hole 4a is formed through the protective insulating film 4.

Figure 5A:
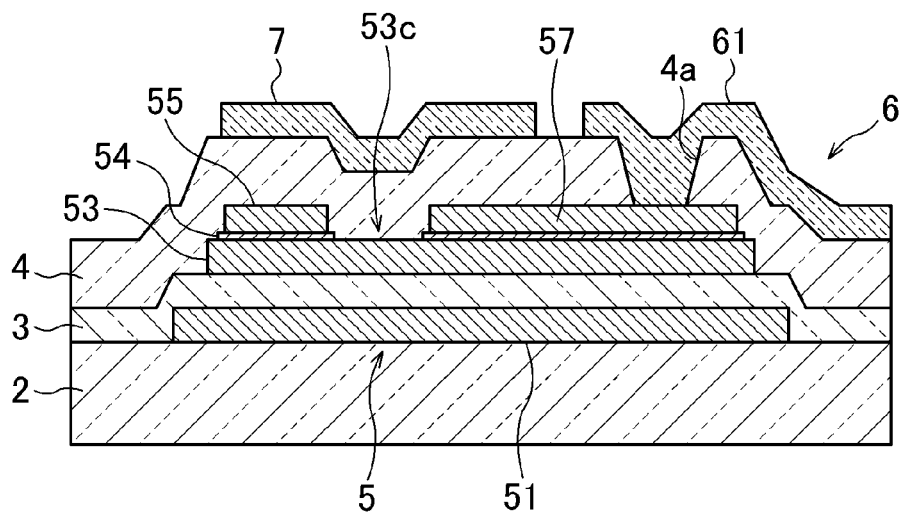
FIGS. 5A and 5B are a sectional view and a flowchart, following
Figure 5B:
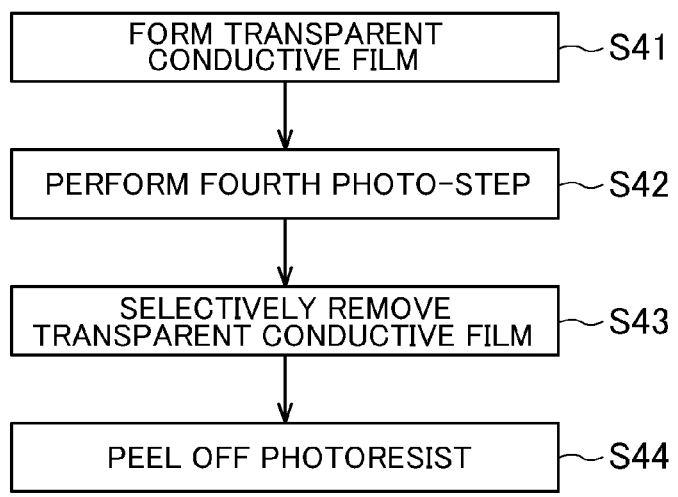

Through the steps illustrated in FIG. 5B, the pixel electrode 6 and the shield 7 are formed. More specifically, first, a transparent conductive film made of an oxide such as ITO is formed on the protective insulating film 4 by sputtering (Step S41). Next, a resist pattern is formed on the transparent conductive film in a fourth photo-step (Step S42). Subsequently, the transparent conductive film is selectively etched (Step S43). Thereafter, the photoresist is peeled off (Step S44). In this manner, the pixel electrode 6 and the shield 7 are formed on the protective insulating film 4. The pixel electrode 6 buries the contact hole 4a formed through the protective insulating film 4 so as to be connected to the drain electrode 57 exposed through the bottom of the contact hole 4a. The shield 7 is provided at a distance from the pixel electrode 6.

Then, the alignment film (not shown) is formed on the protective insulating film 4, the pixel electrode 6, and the shield 7, whereas the polarizing plate (not shown) is provided on the lower surface of the transparent substrate 2. In this manner, the TFT substrate 1 is completed. Further, a liquid crystal panel including the liquid crystal layer sandwiched between the TFT substrate 1 and the CF substrate (not shown) including the color filter is formed. Then, a driving circuit is assembled into the liquid crystal panel to complete the liquid crystal display device.

Other implementations are contemplated. For example, as illustrated in FIG. 6, the shield 7 may be provided between the channel-formation region 53c and the contact hole 4a when viewed in a plan view. In this example, the shield 7 is provided between the source electrode 55 and the contact hole 4a so as to extend in a band-like shape across a region between the source electrode 55 and the contact hole 4a. In this manner, the channel-formation region 53c may be prevented from being affected by the charges accumulated in the vicinity of the contact hole 4*a*. Accordingly, the formation of the back-gate channel in the channel-formation region 53*c* may be suppressed.

For another example, as illustrated in FIG. 7, the shield 7 may be provided on a side with respect to the contact hole 4*a*, which is opposite to the side where the channel-formation region 53*c* is provided, when viewed in a plan view. In this manner, the charges accumulated in the vicinity of the contact hole 4*a* affect the shield 7. Therefore, the channel-formation region 53*c* can be prevented from being affected by the charges accumulated in the vicinity of the contact hole 4*a*.

Figure 8:
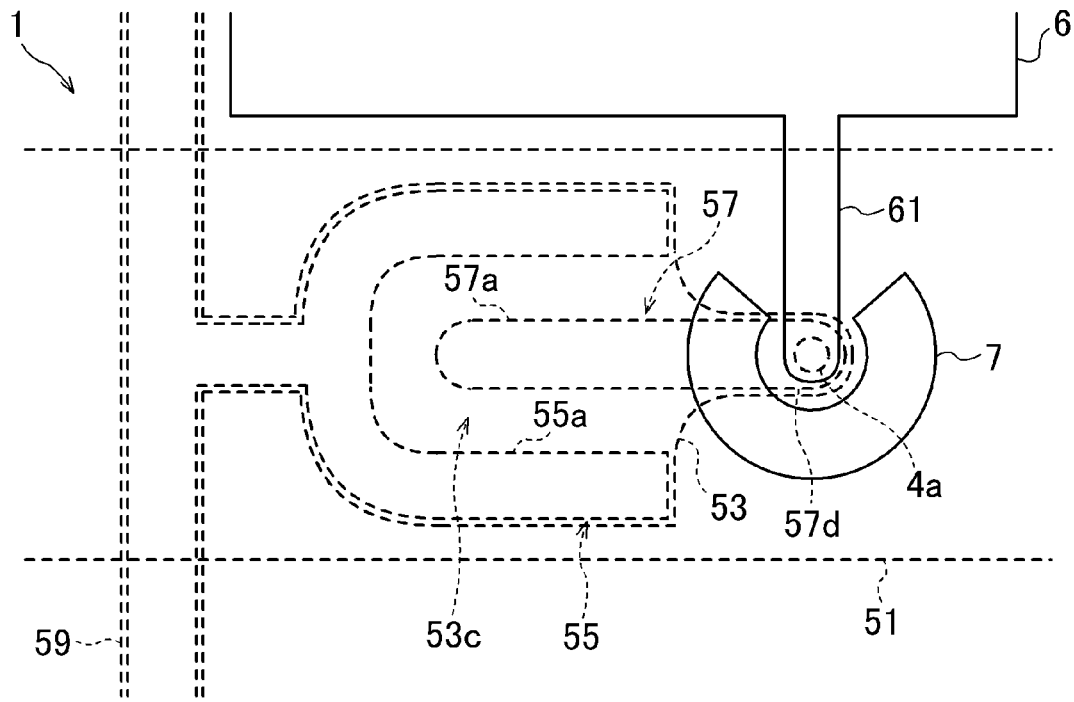
FIG. 8 is a plan view illustrating another exemplary liquid crystal display device of the present application.

In yet another example, as illustrated in FIG. 8, the shield 7 may be provided so as to partially surround the contact hole 4*a* when viewed in a plan view. In this manner, the outward expansion of the effects of the charges accumulated in the vicinity of the contact hole 4*a* of the lead wire 61 of the pixel electrode 6 can be suppressed. Therefore, the channel-formation region 53*c* may be prevented from being affected by the charges accumulated in the vicinity of the contact hole 4*a*.

Figure 9:
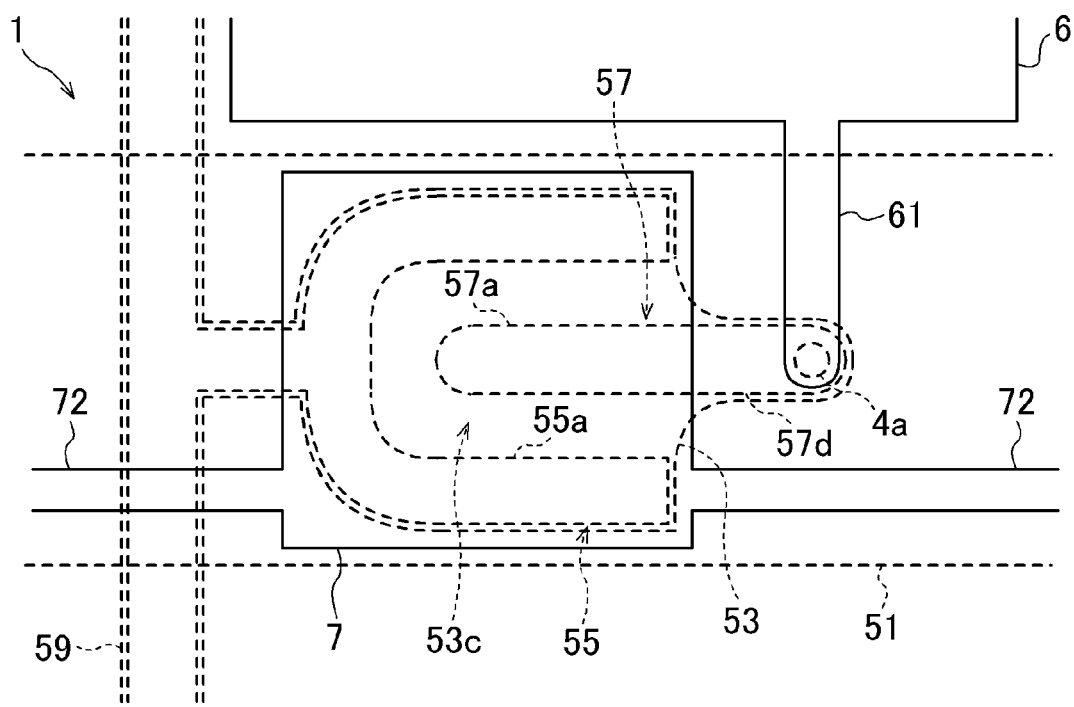
FIG. 9 is a plan view illustrating another exemplary liquid crystal display device of the present application.

In yet another example, as illustrated in FIG. 9, the shield 7 may be connected to the shield 7 of the adjacent pixel through a connection line 72. In this manner, the potentials of the shields 7 provided to the respective pixels can be commonly set to the same value. Moreover, the plurality of examples described above may be appropriately combined with each other. Further, the shield 7 may be formed only above the channel-formation region 53*c*.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A display device comprising:
   a substrate;
   a gate electrode provided on the substrate;
   a gate insulating film provided on the gate electrode;
   a semiconductor layer provided on the gate insulating film;
   a source electrode and a drain electrode provided on the semiconductor layer;
   a protective insulating film provided on the source electrode and the drain electrode;
   a pixel electrode provided on the protective insulating film, and connected to one of the source electrode and the drain electrode through a contact hole formed through the protective insulating film; and
   a shield provided on the protective insulating film, the shield not being electrically connected to the pixel electrode,
   wherein, in a plan view, the semiconductor layer is wholly disposed within an area defined by the gate electrode, and the contact hole is wholly disposed within an area defined by the gate electrode.

2. The display device according to claim 1, wherein:
   the substrate includes a transparent substrate,
   in a plan view, the source electrode and the drain electrode are wholly disposed within an area defined by the semiconductor layer, and
   the pixel electrode and the shield are made from a transparent conductive film.

3. The display device according to claim 1, wherein in a plan view, the shield is provided between the contact hole and a portion of the semiconductor layer between the source electrode and the drain electrode, and the shield does not overlap with the portion of the semiconductor layer between the source electrode and the drain electrode.

4. The display device according to claim 1, wherein the shield is electrically connected to a shield of another pixel.

5. The display device according to claim 1, wherein the display device includes a liquid crystal display device.

6. A display device comprising:
   a substrate;
   a gate electrode provided on the substrate;
   a gate insulating film provided on the gate electrode;
   a semiconductor layer provided on the gate insulating film;
   a source electrode and a drain electrode provided on the semiconductor layer;
   a protective insulating film provided on the source electrode and the drain electrode;
   a pixel electrode provided on the protective insulating film, and connected to one of the source electrode and the drain electrode through a contact hole formed through the protective insulating film; and
   a shield provided on the protective insulating film, an electric potential of the shield being independent from an electric potential of the pixel electrode,
   wherein, in a plan view, the semiconductor layer is wholly disposed within an area defined by the gate electrode, and the contact hole is wholly disposed within an area defined by the gate electrode.

* * * * *